United States Patent
Secareanu et al.

(10) Patent No.: US 7,834,428 B2
(45) Date of Patent: Nov. 16, 2010

(54) APPARATUS AND METHOD FOR REDUCING NOISE IN MIXED-SIGNAL CIRCUITS AND DIGITAL CIRCUITS

(75) Inventors: Radu M. Secareanu, Phoenix, AZ (US); Olin L. Hartin, Phoenix, AZ (US); Emre Salman, Rochester, NY (US)

(73) Assignee: Freescale Semiconductor, Inc., Austin, TX (US)

( * ) Notice: Subject to any disclaimer, the term of this patent is extended or adjusted under 35 U.S.C. 154(b) by 788 days.

(21) Appl. No.: 11/680,430

(22) Filed: Feb. 28, 2007

(65) Prior Publication Data
US 2008/0203494 A1    Aug. 28, 2008

(51) Int. Cl.
*H01L 27/06* (2006.01)
*H01L 23/64* (2006.01)

(52) U.S. Cl. .................. 257/665; 257/296; 257/533; 257/E27.033; 257/E27.045

(58) Field of Classification Search .......... 257/665, 257/206, 296, 533, E27.033, E27.045
See application file for complete search history.

(56) References Cited

U.S. PATENT DOCUMENTS

| | | | | |
|---|---|---|---|---|
| 4,327,368 | A * | 4/1982 | Uchida | 257/373 |
| 4,672,584 | A * | 6/1987 | Tsuji et al. | 365/226 |
| 4,805,008 | A * | 2/1989 | Yao et al. | 257/376 |
| 4,922,317 | A * | 5/1990 | Mihara | 257/372 |
| 5,014,105 | A * | 5/1991 | Hata et al. | 257/371 |
| 5,122,855 | A * | 6/1992 | Shirai | 257/370 |
| 5,317,183 | A | 5/1994 | Hoffman et al. | |
| 5,338,986 | A * | 8/1994 | Kurimoto | 327/566 |
| 5,475,255 | A | 12/1995 | Joardar et al. | |
| 5,714,796 | A * | 2/1998 | Chishiki | 257/544 |
| 5,864,168 | A | 1/1999 | Nasserbakht | |
| 5,892,263 | A * | 4/1999 | Tachiyama | 257/370 |
| 6,020,614 | A | 2/2000 | Worley | |
| 6,995,431 | B2 | 2/2006 | Fujimori | |
| 7,397,641 | B2 * | 7/2008 | Chu et al. | 361/56 |

OTHER PUBLICATIONS

Salman et al., Substrate Noise Reduction Based on Noise Aware Cell Design, IEEE, 2007, pp. 3227-3230.*

(Continued)

*Primary Examiner*—David Vu
*Assistant Examiner*—Earl N Taylor
(74) *Attorney, Agent, or Firm*—Ingrassia, Fisher & Lorenz, P.C.

(57) ABSTRACT

Apparatus and a method are provided for reducing noise in mixed-signal and digital circuits. One apparatus (200) includes a metal-oxide-semiconductor field-effect transistor (MOSFET) (210). MOSFET (210) includes a doped substrate (2210) with a source formed proximate a substrate tie (2224) and a substrate tie (2250) adjacent substrate (2210). A ground rail (255) is coupled to the source and substrate tie (2224), and a ground rail (285) is coupled to substrate tie (2250). Ground rails (255) and (285) are configured to be coupled to different ground networks (250 and 280). One method includes producing a model of a semiconductor device including a standard semiconductor cell (710). The semiconductor cell is identified as a noise-sensitive or a noise-producing semiconductor cell (720), and the semiconductor cell is replaced with a corresponding noise-aware semiconductor cell (730).

16 Claims, 6 Drawing Sheets

OTHER PUBLICATIONS

Kao et al., Digital Block Modeling and Substrate Noise Aware Floorplanning for Mixed Signal SOCs, IEEE, 2007, pp. 1935-1938.*
Lee et al., Noise-Aware Design for ESD Reliability in Mixed-Signal Integrated Circuits, IEEE, 2001, pp. 437-441.*
Popovich et al., Noise Aware Decoupling Capacitors for Multi-Voltage Power Distribution Systems, ISQED, 2005, 6 pages.*
Nagata, M. et al., Quantitive Characterization of Substrate Noise for Physical Design Guides in Digital Circuits, Proceedings of IEEE Custom Integrated Circuits Conference, pp. 95-98, 2000.
D'Abreum M., Noise, Its source, and impact on Design and Test of Mixed Signal Circuits, Proceedings of the first IEEE international Workshop on Electronic Design, Test and Application, 2002.

* cited by examiner

APPARATUS AND METHOD FOR REDUCING NOISE IN MIXED-SIGNAL CIRCUITS AND DIGITAL CIRCUITS

FIELD OF THE INVENTION

The present invention generally relates to semiconductor devices, and more particularly relates to apparatus and method for reducing noise in mixed-signal and digital circuits.

BACKGROUND OF THE INVENTION

The integrity of analog/RF circuit signal and digital circuit signals is an important factor when designing a mixed-signal circuit or a digital circuit. Three components responsible for decreasing the signal integrity of mixed-signal and digital circuits are ground noise, power supply noise, and substrate noise. As the noise from one or more of these noise sources is reduced, the integrity of mixed signal circuit and a digital circuit signals increases.

A mixed-signal circuit includes analog/RF circuits and digital circuits on the same substrate. Because the analog/RF circuits and digital circuits use a common substrate, a signal path is created between the noisy digital portion(s) and the noise-sensitive analog/RF portion(s) of the circuit. Thus, signal isolation of sensitive analog/RF circuits from the noisy digital circuits is desirable.

In digital circuits, noise on the power and ground rails has a resistive (IR drop) noise component and an inductive (L di/dt) noise component. Therefore, IR drop noise and L di/dt noise present on ground and/or power rails propagate into the substrate through substrate ties and well ties.

In modern application-specific integrated circuit (ASIC) design, each logic function (e.g., OR, NOR, AND, NAND, etc.) is represented by a "standard cell," and the various standard cells are typically grouped together to form a "library" of standard cells. Additionally, the library usually contains multiple standard cells of the same logic function, but with differing characteristics (e.g., area, speed, power consumption, etc.).

When designing a semiconductor device, a designer may use the various cells in the library to create a desired semiconductor device. The variety of standard cells enables designers to more efficiently create semiconductor designs, and indirectly gives the designer implementation tradeoffs (e.g., area vs. speed vs. power consumption).

Though current libraries include different implementations of the same logic function, these libraries do not include reduced-noise cells ("noise-aware" cells) capable of performing the standard cell logic functions. Accordingly, it is desirable to provide semiconductor cells for reducing noise in mixed-signal and digital circuits. In addition, it is desirable to provide a method for designing a semiconductor device using a standard cell library and a noise-aware library. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

Figure 1:
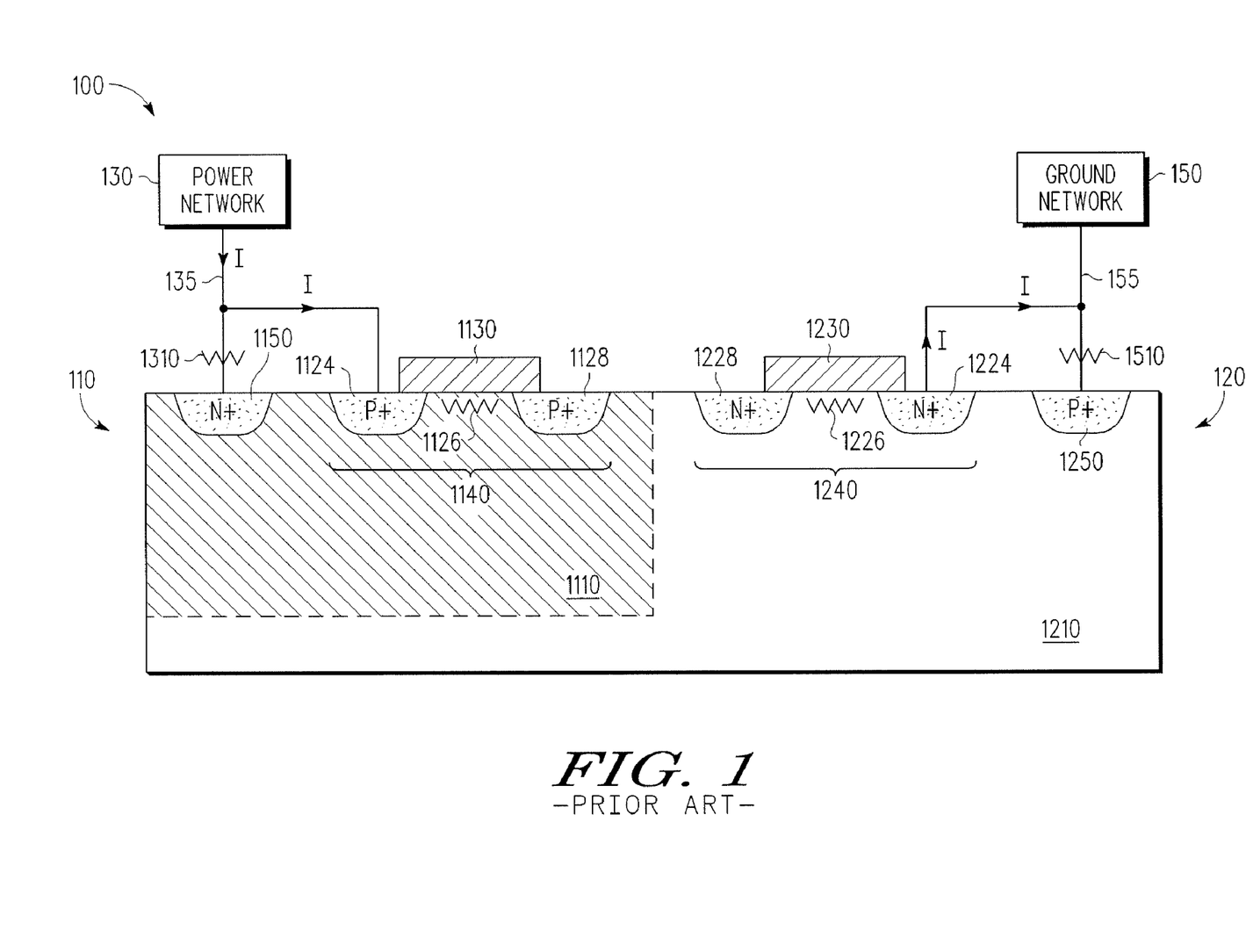
FIG. 1 is a schematic diagram of a prior art semiconductor cell.

FIG. 1 is a schematic diagram of a semiconductor cell 100 commonly referred to as a complementary metal-oxide-semiconductor (CMOS) device. Semiconductor cell 100 includes a positive channel metal-oxide-semiconductor (PMOS) transistor 110 formed in a negatively doped well (N-well) 1110 and negative channel metal-oxide-semiconductor (NMOS) transistor 120 formed in a positively doped substrate (P-substrate) 1210.

N-well 1110 includes a positively doped diffusion area (P-area) 1124 (e.g., a source) and a P-area 1128 (e.g., a drain) formed therein. A gate 1130 (including an underlying gate dielectric (not shown)) is formed on N-well 1110 such that a portion of gate 1130 overlies a portion of P-areas 1124 and 1128 to form a source-gate-drain region 1140.

N-well 1110 also includes a negatively doped well tie (N-well tie) 1150 formed therein and spaced apart from P-area 1124. N-well tie 1150 and P-area 1124 are each coupled to a power network 130 via a power rail 135.

P-substrate 1210 of NMOS transistor 120 includes a negatively doped diffusion area (N-area) 1224 (e.g., a source) and an N-area 1228 (e.g., a drain) formed therein. A gate 1230 (including an underlying gate dielectric (not shown)) is formed on P-substrate 1210 such that a portion of gate 1230 overlies a portion of N-areas 1224 and 1228 to form a source-gate-drain region 1240.

Also formed in P-substrate 1210 is a positive substrate tie (P-substrate tie) 1250 spaced apart from N-area 1224. P-substrate tie 1250 and N-area 1224 are each coupled to a ground network 150 via a ground rail 155.

In a mixed-signal circuit, there are multiple types of noise propagated into P-substrate 1210: power network noise 1310, ground network noise 1510, source-drain junction noise 1126, source-drain junction noise 1226, and impact ionization. Of these noise types, ground network noise 1510 is the dominant noise propagated into P-substrate 1210 because ground network 150 is directly connected to P-substrate 1210 by N-area 1224 (part of NMOS transistor 120) and P-substrate tie 1250. The next dominant noise in mixed-signal circuits is power network noise 1310 because power network 130 is also connected to P-substrate 1210, but not directly connected (i.e., connected to power network 130 via P-area 1124 and N-well tie 1150 (each is a portion of PMOS transistor 110), all coupling to P-substrate 1210 through N-well 1110).

The cause of IR drop noise and/or L di/dt noise on power rail 135 and/or ground rail 155 in a digital circuit is the switching current (I) of semiconductor cell 100. When multiple digital gates (e.g., multiple gates of PMOS transistor 110 and NMOS transistor 120 (each pair interconnecting as a digital gate)) sharing the same power 130 and ground network 150 switch at the same time, ground network noise 1510 and/or power network noise 1310 may become considerably large which, in turn, translates into a large amount of noise propagated into P-substrate 1210.

The following description of the various embodiments of the invention is merely exemplary in nature and is not intended to limit the invention, application of the invention, and/or uses of the invention. Furthermore, there is no intention to be bound by any theory presented in the preceding or following sections.

Figure 2:
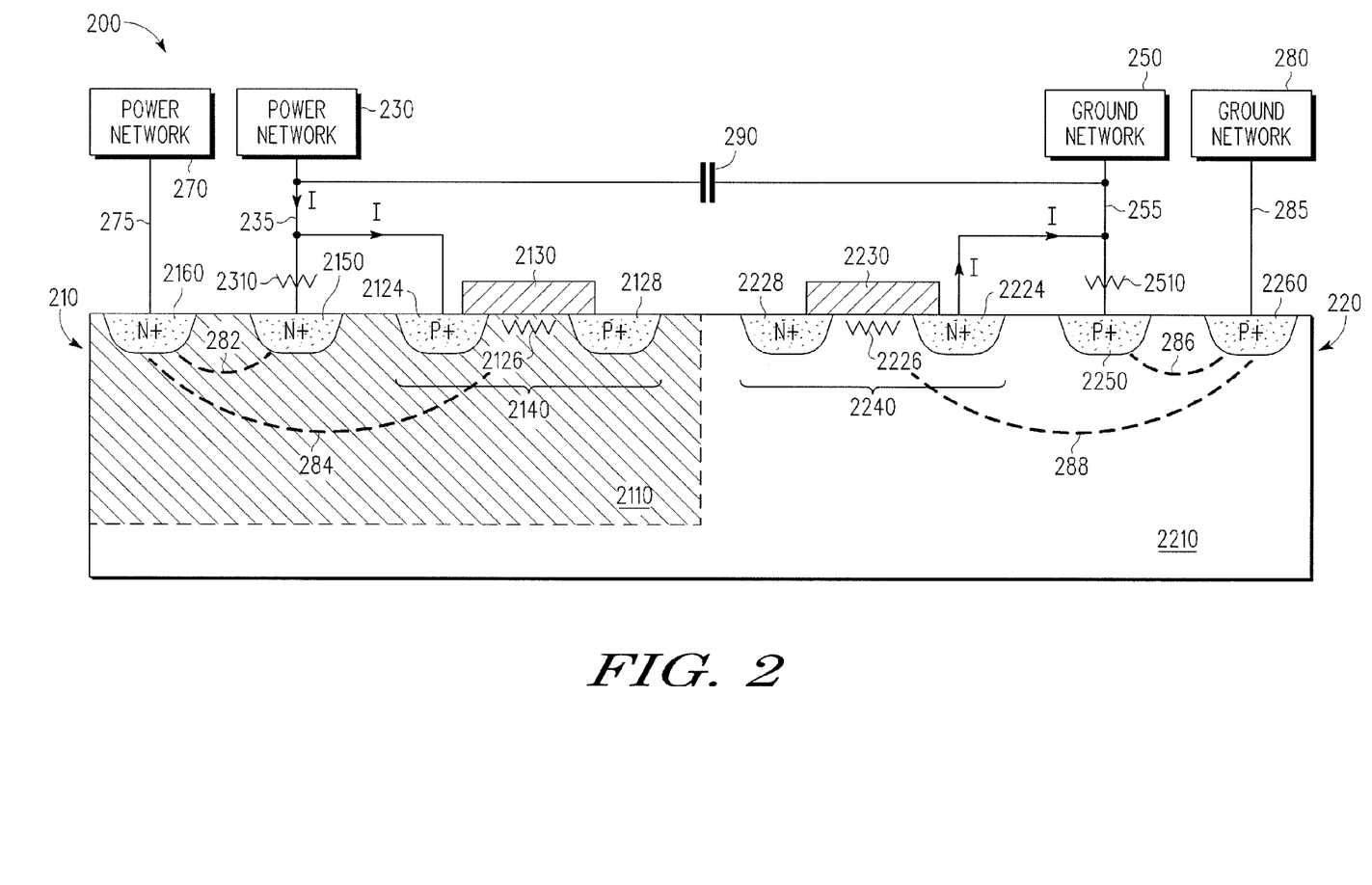
FIG. 2 is a schematic diagram of one exemplary embodiment of a semiconductor cell with reduced noise.

FIG. 2 is a schematic diagram of one exemplary embodiment of a semiconductor cell 200 (e.g., a CMOS device) with reduced noise. Semiconductor cell 200 includes a PMOS transistor 210 formed in an N-well 2110 and an NMOS transistor 220 formed in a P-substrate 2210.

N-well 2110 includes a P-area 2124 (e.g., a source) and a P-area 2128 (e.g., a drain) formed therein. A gate 2130 (including an underlying gate dielectric (not shown)) is formed on N-well 2110 such that a portion of gate 2130 overlies a portion of both P-area 2124 and P-area 2128 to form a source-gate-drain region 2140.

N-well 2110 also includes an N-well tie 2150 and an N-well tie 2160 formed therein. N-well tie 2150 is spaced apart from P-area 2124 and is oriented between N-well tie 2160 and P-area 2124. Furthermore, N-well tie 2150 and P-area 2124 are each coupled to a power network 230 via a power rail 235.

N-well tie 2160 is spaced apart from both N-well tie 2150 and P-area 2124, and is coupled to a power network 270 via a power rail 275. As illustrated in FIG. 2, power network 270 is a different power network from power network 230, and power rail 275 is a different power rail from power rail 235.

The inclusion of power network 270 and power rail 275 creates a signal path 282 for power network noise 2310 to travel between N-well tie 2150 and N-well tie 2160. Furthermore, power network 270 and power rail 275 also create a signal path 284 for gate-source junction noise 2126 to travel between source-gate-drain region 2140 and N-well tie 2160. Because signal paths 282 and/or 284 are created, less power network noise 2310 and/or gate-source junction noise 2126 is propagated into P-substrate 2210.

P-substrate 2210 of NMOS transistor 220 includes a negatively doped area (N-area) 2224 (e.g., a source) and an N-area 2228 (e.g., a drain) formed therein. A gate 2230 (including an underlying gate dielectric (not shown)) is formed on P-substrate 2210 such that a portion of gate 2230 overlies a portion of both N-area 2224 and N-area 2228 to form a source-gate-drain region 2240.

Also formed in P-substrate 2210 is a positively doped substrate tie (P-substrate tie) 2250 and a P-substrate tie 2260. P-substrate tie 2250 is spaced apart from N-area 2224, and P-substrate tie 2250 and N-area 2224 are each coupled to a ground network 250 via a ground rail 255.

P-substrate tie 2260 is spaced apart from both P-substrate tie 2250 and N-area 2224, and coupled to a ground network 280 via a ground rail 285, wherein ground network 280 is a different ground network from ground network 250 and ground rail 285 is a different ground rail from ground rail 255. As illustrated in FIG. 2, P-substrate tie 2250 is oriented between P-substrate tie 2260 and N-area 2224. In another embodiment (see e.g., FIG. 5), P-substrate tie 2260 is oriented between P-substrate tie 2250 and N-area 2224.

The inclusion of ground network 280 and ground rail 285 creates a signal path 286 for ground network noise 2510 to travel between P-substrate tie 2250 and P-substrate tie 2260. Furthermore, ground network 280 and ground rail 285 also create a signal path 288 for gate-source junction noise 2226 noise to travel between source-gate-drain region 2240 and P-substrate tie 2260. Because signal paths 286 and/or 288 are created, less ground network noise 2510 and/or gate-source junction noise 2226 is propagated into P-substrate 2210.

Semiconductor cell 200 also includes a decoupling capacitor system 290 (see FIG. 3) comprised of one or more capacitive elements $C_1$ and/or $C_2$ (e.g., capacitors) and/or one or more impedance elements $Z_1$ and/or $Z_2$ (e.g., parasitic resistance (R) and inductance (L)) coupled between power network 230 and ground network 250. Decoupling capacitor system 290 may include different areas and/or sizing depending on the needs of semiconductor cell 200.

To determine the area and sizing of decoupling capacitor system 290, a diagram (see FIG. 4) of a decoupling capacitive system is utilized. One or more capacitive layers are placed an increasing distance from semiconductor cell 200. The charge drawn by the load from power network 230 equals the area of the triangle. The total charge required is divided by $t_1$ into two regions. $t_R$ denotes the slew rate (analog/RF) or rise time (digital) of the load. $I_{max}$ is the maximum current required by the load. Nodes 1, 2, and 3 are the internal nodes of decoupling capacitor system 290. In the equations below, a notation such as $V_3^2$ should be read as the voltage at node 3 at time $t_2$. Moreover, each level of decoupling capacitor system 290 is designed to provide charge during a particular time interval (e.g., $t_1$ to $t_2$).

Figure 4:
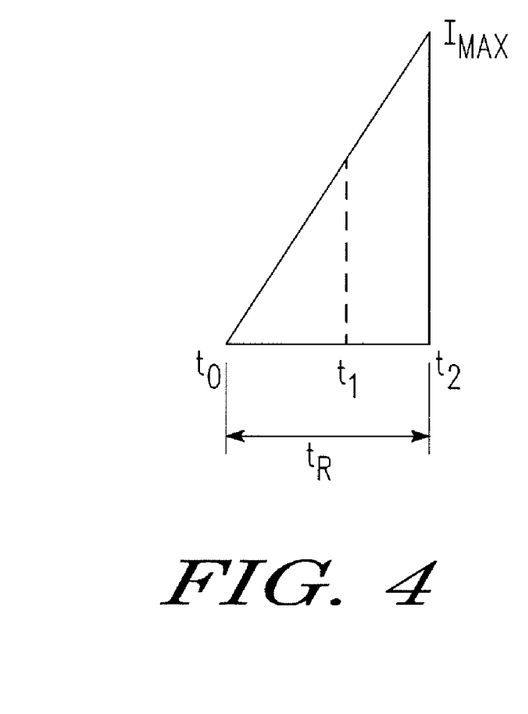
FIG. 4 is a diagram representing the charge drawn by the load from a power network included in the semiconductor cell of FIGS. 2 and 5.

Considering, for example, two levels of distributed on-chip decoupling capacitive elements, the following system of fourteen equations with fourteen unknowns can be written:

For the first time interval ($t_1$):

$$I_2^1 = \frac{2 \cdot C_2 \cdot (V_{dd} - V_3^1)}{t_1}, \quad 1)$$

meaning that the current provided by the second capacitor during the first time interval (immediately after switching event occurs) is due to a voltage drop from $V_{dd}$ to voltage level at the second capacitor after the first time interval ($V_3^1$).

2) $V_2^1 = V_3^1 - Z_2 \cdot I_2^1$, which indicates that the voltage drop at the first capacitor during the first time interval is caused by the current from 1) flowing through impedance connecting the first and second capacitors.

$$I_1^1 = \frac{2 \cdot C_1 \cdot (V_{dd} - V_2^1)}{t_1}, \quad 3)$$

meaning that the current provided by the first capacitor during the first time interval (main current) is due to a voltage drop from $V_{dd}$ to voltage level at the first capacitor after the first time interval ($V_2^1$).

4) $V_1^1 = V_2^1 - Z_1 \cdot (I_1^1 + I_2^1)$, defines the voltage drop at the first capacitor during the first time interval, which is determined by the voltage drop from the voltage level at the second capacitor after the first time interval caused by the currents from capacitor one and two flowing through the impedance between the first capacitor and the current load.

For the second time interval ($t_2$):

$$V_3^2 = V_1^1 + (V_3^1 - V_1^1) \cdot \left(1 - e^{\frac{-t_2}{t_1 + t_2}}\right) \quad 5)$$

determines the voltage drop at the second capacitor after the rise time (final voltage level). This equation incorporates the charge redistribution phenomenon between the two capacitors during rise time. It also considers different time constants for each capacitor (bank of capacitors). In other words, the ripple propagating from the current load to the final stage is defined by the voltage levels at the load and the last capacitor after the first time interval and time constants of each capacitor.

$$I_2^2 + I_2^1 = \frac{2 \cdot C_2 \cdot (V_3^1 - V_3^2)}{t_2}, \quad 6)$$

indicates that the total current provided by the second capacitor during an entire switching event (rise time) is due to voltage drop at the second capacitor during the second time interval.

7) $V_2^2 = V_3^2 - I_2^2 \cdot Z_2$, meaning that the voltage drop at the first capacitor during the second time interval is due to current from the second capacitor flowing through impedance between the first and second capacitors.

$$I_1^2 + I_1^1 = \frac{2 \cdot C_1 \cdot (V_2^1 - V_2^2)}{t_2}, \quad 8)$$

indicates that the total current provided by the first capacitor during the rise time is due to the voltage drop at the first capacitor during the second time interval.

9) $V_1^2 = V_2^2 - Z_1 \cdot (I_1^2 + I_2^2)$, meaning that the voltage drop at the current load during the second time interval is caused by the currents from the first and second capacitors flowing through the impedance between the first capacitor and the current load.

General Equations:

10) $t_1 = Z_1 \cdot C_1$, defines the time constant of the first capacitor which is equivalent to the impedance between the first capacitor and the current load times the size of the first capacitor.

11) $t_2 = Z_2 \cdot C_2$, defines the time constant of the second capacitor which is equivalent to the impedance between the first and second capacitors times the size of the second capacitor.

12) $t_R = t_1 + t_2$, states that the total sum of all time intervals (the first and the second) should be equal to rise time, meaning that each capacitor provides the main part of the total current during particular short time interval. All together they provide the total current during the rise time.

13) $I_{max} = I_1^2 + I_2^2$, meaning that the peak (maximum) current drawn by the load is the sum of currents provided by capacitor one and two during the second time interval.

$$\frac{I_{max} \cdot t_r}{2} = \frac{(I_1^1 + I_2^1) \cdot t_1}{2} + \frac{((I_2^2 + I_1^2) - (I_2^1 + I_1^1)) \cdot t_2}{2} + (I_1^1 + I_2^1) \cdot t_2, \quad 14)$$

indicates that the total charge required during rise time is equal to the sum of all charges released by capacitors one and two during each time interval.

Figure 3:
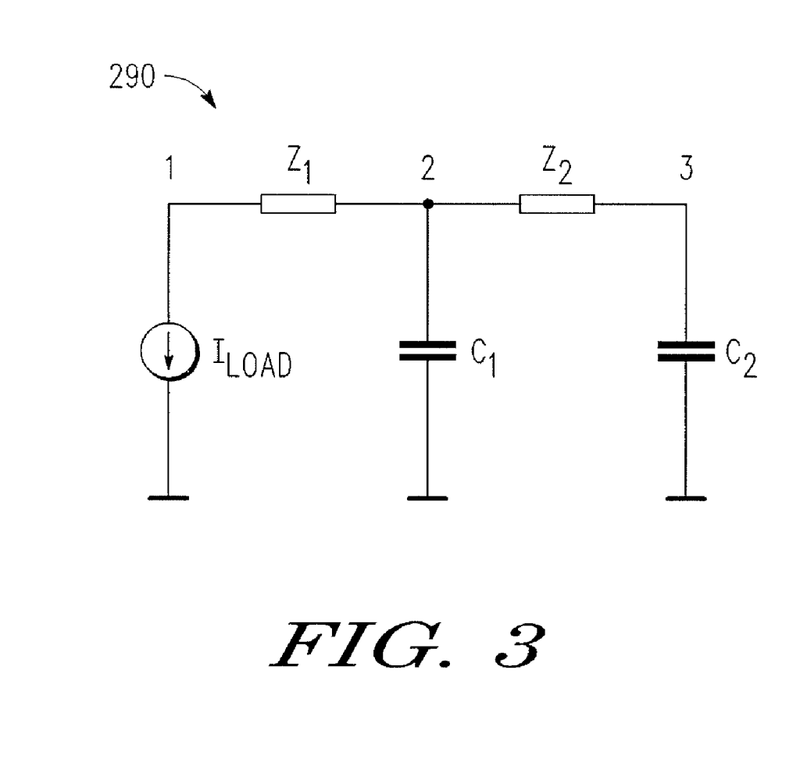
FIG. 3 is a schematic diagram of one exemplary embodiment of a decoupling capacitor system included in the semiconductor cell of FIGS. 2 and 5.

The five input parameters for decoupling capacitor system 290 are power supply voltage ($V_{dd}$), maximum required current ($I_{max}$), rise time ($t_R$), minimum voltage level ($V_1^2$), and initial voltage drop at the second capacitor ($V_3^1$). Decoupling capacitor system 290 is sized according to the above system of equations for a 90 nanometer technology (e.g., $V_{dd}$=1.2 volts, $I_{max}$=1 mA, $t_R$=10 ps, and $V_1^2$=100 mV). However, other nanometer technologies with their corresponding power supply voltage ($V_{dd}$), maximum required current ($I_{max}$), rise time ($t_R$), minimum voltage level ($V_1^2$), and initial voltage drop at the second capacitor ($V_3^1$) are contemplated.

As described above, the first level of decoupling capacitor system 290 is fast and provides the current to semiconductor cell 200 for the first 2.5 ps. Then, the second level provides most of the charge to semiconductor cell 200. Of note, while decoupling capacitor system 290 is described as having two layers, decoupling capacitor system 290 may include a fewer number or a greater number of capacitive layers depending on the needs of semiconductor cell 200.

Figure 5:
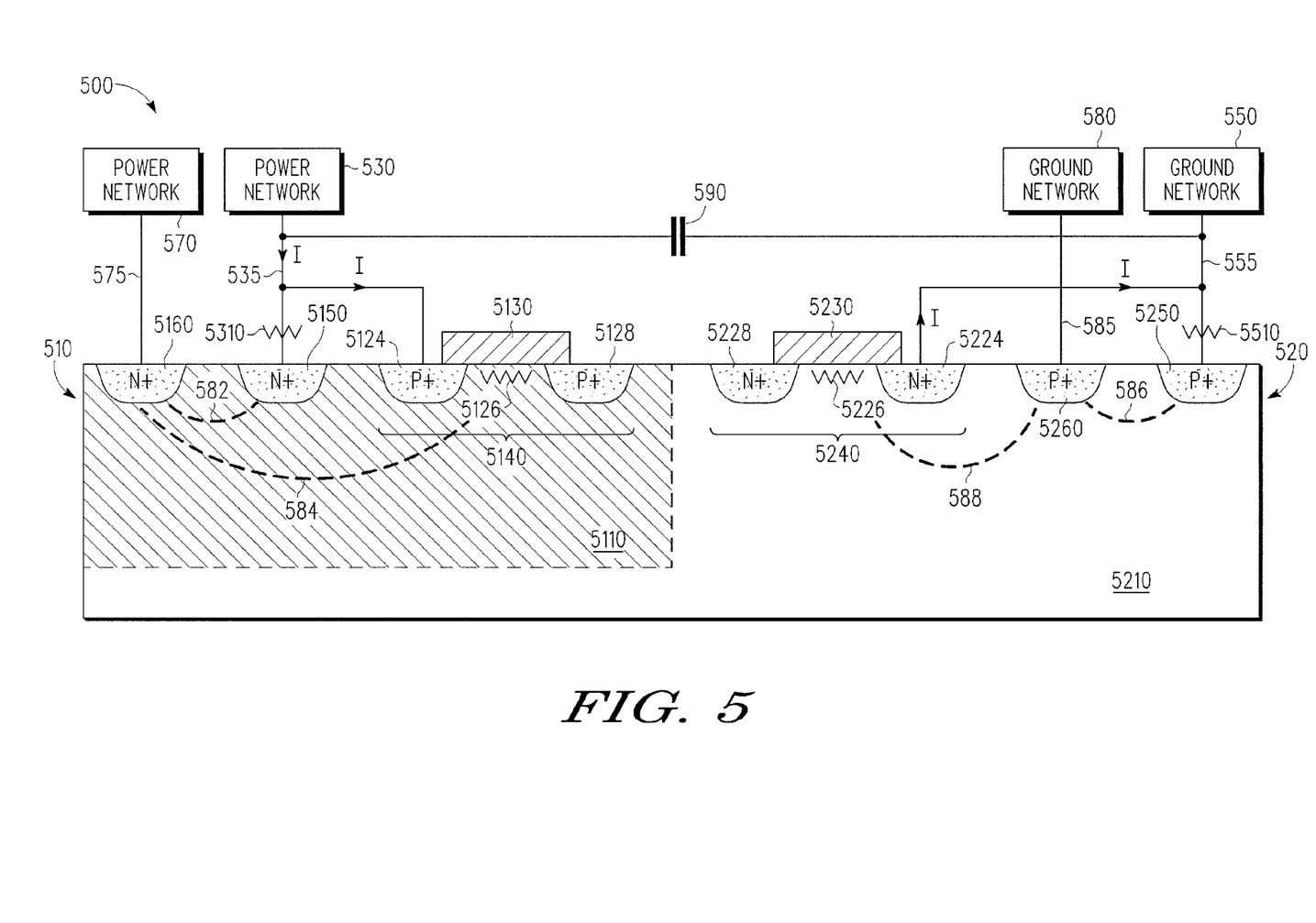
FIG. 5 is a schematic diagram of another exemplary embodiment of a semiconductor cell with reduced noise.

FIG. 5 is a schematic diagram of one exemplary embodiment of a semiconductor cell 500 (e.g., a CMOS device) with reduced noise. Semiconductor cell 500 includes an NMOS transistor 510 formed in a positively doped well (P-well) 5110 and a PMOS transistor 520 formed in a negatively doped substrate (N-substrate) 5210.

P-well 5110 includes an N-area 5124 (e.g., a source) and an N-area 5128 (e.g., a drain) formed therein. A gate 5130 (including an underlying gate dielectric (not shown)) is formed on P-well 5110 such that a portion of gate 5130 overlies a portion of both N-area 5124 and N-area 5128 to form a source-gate-drain region 5140.

P-well 5110 also includes a positively doped well tie (P-well tie) 5150 and a P-well tie 5160 formed therein. P-well tie 5150 is spaced apart from N-area 5124 and is oriented between P-well tie 5160 and N-area 5124. Furthermore, P-well tie 5150 and N-area 5124 are each coupled to a power network 530 via a power rail 535.

P-well tie 5160 is spaced apart from both P-well tie 5150 and N-area 5124, and is coupled to a power network 570 via a power rail 575. As illustrated in FIG. 5, power network 570 is a different power network from power network 530, and power rail 575 is a different power rail from power rail 535.

The inclusion of power network 570 and power rail 575 creates a signal path 582 for power network noise 5310 to travel between P-well tie 5150 and P-well tie 5160. Furthermore, power network 570 and power rail 575 also create a signal path 584 for gate-source junction noise 5126 to travel between source-gate-drain region 5140 and P-well tie 5160. Because signal paths 582 and/or 584 are created, less power network noise 5310 and/or gate-source junction noise 5126 is propagated into N-substrate 5210.

N-substrate 5210 of PMOS transistor 520 includes a P-area 5224 (e.g., a source) and a P-area 5228 (e.g., a drain) formed therein. A gate 5230 (including an underlying gate dielectric (not shown)) is formed on N-substrate 5210 such that a portion of gate 5230 overlies a portion of both P-area 5224 and P-area 5228 to form a source-gate-drain region 5240.

Also formed in N-substrate 5210 is a negatively doped substrate tie (N-substrate tie) 5250 and an N-substrate tie 5260. N-substrate tie 5250 is spaced apart from P-area 5224, and N-substrate tie 5250 and P-area 5224 are each coupled to a ground network 550 via a ground rail 555.

N-substrate tie 5260 is spaced apart from both N-substrate tie 5250 and P-area 5224, and coupled to a ground network 580 via a ground rail 585, wherein ground network 580 is a different ground network from ground network 550 and ground rail 585 is a different ground rail from ground rail 555. As illustrated in FIG. 5, N-substrate tie 5260 is oriented between N-substrate tie 5250 and P-area 5224. In another embodiment (see e.g., FIG. 2), N-substrate tie 5250 is oriented between N-substrate tie 5260 and P-area 5224.

The inclusion of ground network 580 and ground rail 585 creates a signal path 586 for ground network noise 5510 to travel between N-substrate tie 5250 and N-substrate tie 5260. Furthermore, ground network 580 and ground rail 585 also create a signal path 588 for gate-source junction noise 5226 noise to travel between source-gate-drain region 5240 and N-substrate tie 5260. Because signal paths 586 and/or 588 are created, less ground network noise 5510 and/or gate-source junction noise 5226 is propagated into N-substrate 5210.

Semiconductor cell 500 also includes a decoupling capacitor system 590 (see e.g., FIG. 3) coupled between power network 530 and ground network 550. The area and sizing of decoupling capacitor system 590 may be determined in a manner similar to decoupling capacitor system 290 (see FIG. 2) and need not be repeated.

Figure 6:
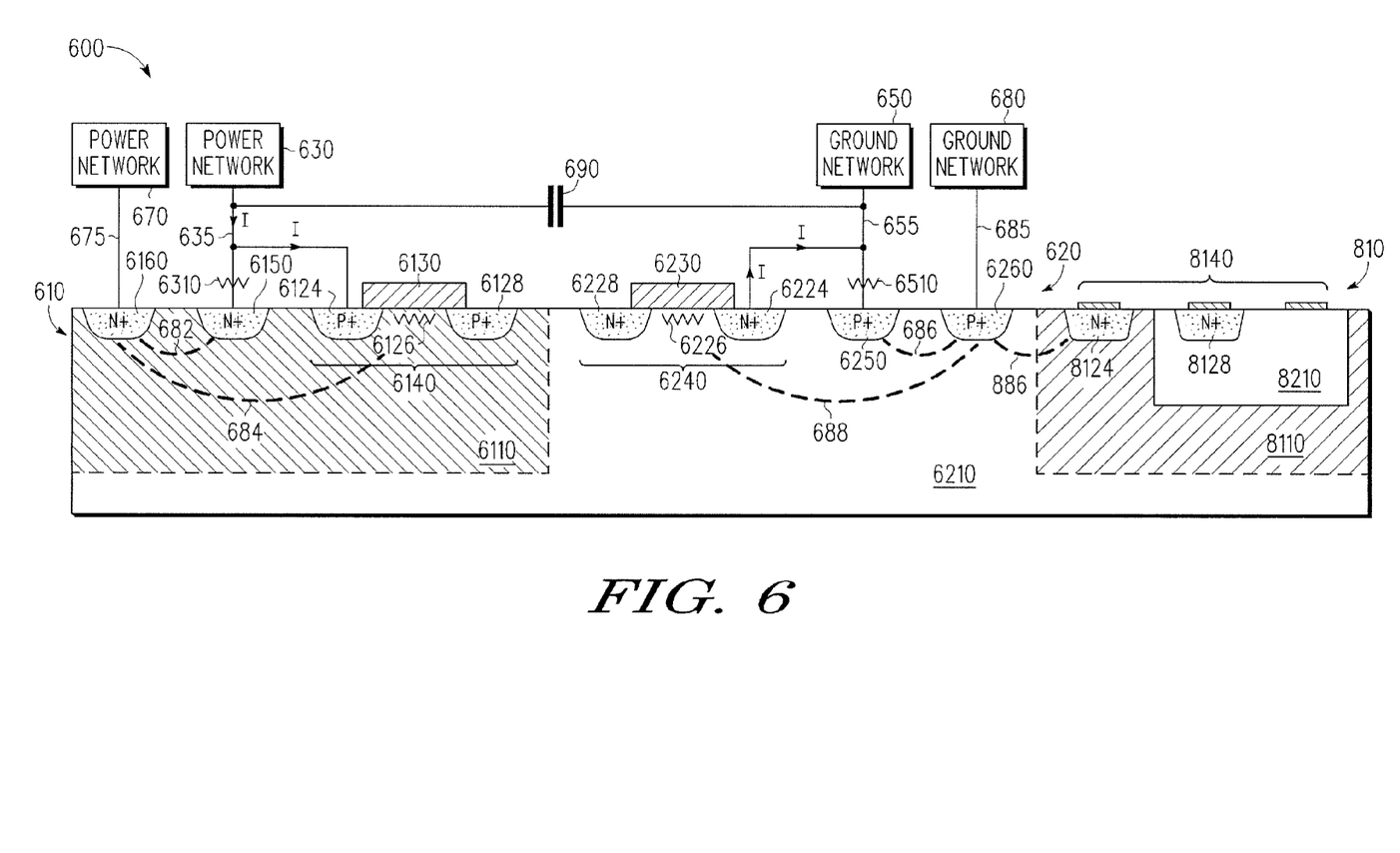
FIG. 6 is a schematic diagram of yet another exemplary embodiment of a semiconductor cell with reduced noise.

FIG. 6 is a schematic diagram of one exemplary embodiment of a semiconductor cell 600 (e.g., a bipolar complementary metal-oxide-semiconductor (BiCMOS) device) with reduced noise. Semiconductor cell 600 includes a PMOS transistor 610 formed in an N-well 6110, an NMOS transistor 620 formed in a P-substrate 6210, and a bipolar device 810 (e.g., a bipolar junction transistor) formed in P-substrate 6210.

N-well 6110 includes a P-area 6124 (e.g., a source) and a P-area 6128 (e.g., a drain) formed therein. A gate 6130 (including an underlying gate dielectric (not shown)) is formed on N-well 6110 such that a portion of gate 6130 overlies a portion of both P-area 6124 and P-area 6128 to form a source-gate-drain region 6140.

N-well 6110 also includes an N-well tie 6150 and an N-well tie 6160 formed therein. N-well tie 6150 is spaced apart from P-area 6124 and is oriented between N-well tie 6160 and P-area 6124. Furthermore, N-well tie 6150 and P-area 6124 are each coupled to a power network 630 via a power rail 635.

N-well tie 6160 is spaced apart from both N-well tie 6150 and P-area 6124, and is coupled to a power network 670 via a power rail 675. As illustrated in FIG. 6, power network 670 is a different power network from power network 630, and power rail 675 is a different power rail from power rail 635.

The inclusion of power network 670 and power rail 675 creates a signal path 682 for power network noise 6310 to travel between N-well tie 6150 and N-well tie 6160. Furthermore, power network 670 and power rail 675 also create a signal path 684 for gate-source junction noise 6126 to travel between source-gate-drain region 6140 and N-well tie 6160. Because signal paths 682 and/or 684 are created, less power network noise 6310 and/or gate-source junction noise 6126 is propagated into P-substrate 6210.

P-substrate 6210 of NMOS transistor 620 includes a negatively doped area (N-area) 6224 (e.g., a source) and an N-area 6228 (e.g., a drain) formed therein. A gate 6230 (including an underlying gate dielectric (not shown)) is formed on P-substrate 6210 such that a portion of gate 6230 overlies a portion of both N-area 6224 and N-area 6228 to form a source-gate-drain region 6240.

Also formed in P-substrate 6210 is a positively doped substrate tie (P-substrate tie) 6250 and a P-substrate tie 6260. P-substrate tie 6250 is spaced apart from N-area 6224, and P-substrate tie 6250 and N-area 6224 are each coupled to a ground network 650 via a ground rail 655.

P-substrate tie 6260 is spaced apart from both P-substrate tie 6250 and N-area 6224, and coupled to a ground network 680 via a ground rail 685, wherein ground network 680 is a different ground network from ground network 650 and ground rail 685 is a different ground rail from ground rail 655. As illustrated in FIG. 6, P-substrate tie 6250 is oriented between P-substrate tie 6260 and N-area 6224. In another embodiment (see e.g., FIG. 5), P-substrate tie 6260 is oriented between P-substrate tie 6250 and N-area 6224.

The inclusion of ground network 680 and ground rail 685 creates a signal path 686 for ground network noise 6510 to travel between P-substrate tie 6250 and P-substrate tie 6260. Furthermore, ground network 680 and ground rail 685 also create a signal path 688 for gate-source junction noise 6226 noise to travel between source-gate-drain region 6240 and P-substrate tie 6260. Because signal paths 686 and/or 688 are created, less ground network noise 6510 and/or gate-source junction noise 6226 is propagated into P-substrate 6210.

P-substrate 6210 also includes an N-well 8110 of bipolar device 810 formed therein. N-well 8110 includes an N-area 8124 (e.g., a collector), where the collector is proximate to P-substrate tie 6260, and where a positively doped well 8210 (P-well) forms a base formed therein.

Furthermore, bipolar device 810 includes an N-area 8128 (e.g., an emitter) formed in P-well 8210. Accordingly, N-area 8128, P-well 8210, and N-area 8124 form an emitter-base-collector region 8140.

The formation of emitter-base-collector region 8140 also creates a noise signal path 886 between N-well 8110 and P-substrate tie 6260. The inclusion of signal path 886 results in less noise from emitter-base-collector region 8140 being propagated into substrate 6210.

Semiconductor cell 600 also includes a decoupling capacitor system 690 (see e.g., FIG. 3) coupled between power network 630 and ground network 650. The area and sizing of decoupling capacitor system 690 may be determined in a manner similar to decoupling capacitor system 290 (see FIG. 2) and need not be repeated.

Although semiconductor cell 600 has been discussed with various positively and negatively doped substrates, wells, and well ties, various embodiments contemplate that the polarities of the substrates, wells, and well ties may be switched. That is, PMOS transistor 610 may be an NMOS transistor, NMOS transistor 620 may be a PMOS transistor, and bipolar device 810 (an N-P-N transistor) may be a P-N-P bipolar junction transistor, or any other suitable combinations of PMOS transistors, NMOS transistors, P-N-P bipolar junction transistors, and N-P-N bipolar junction transistors.

Figure 7:
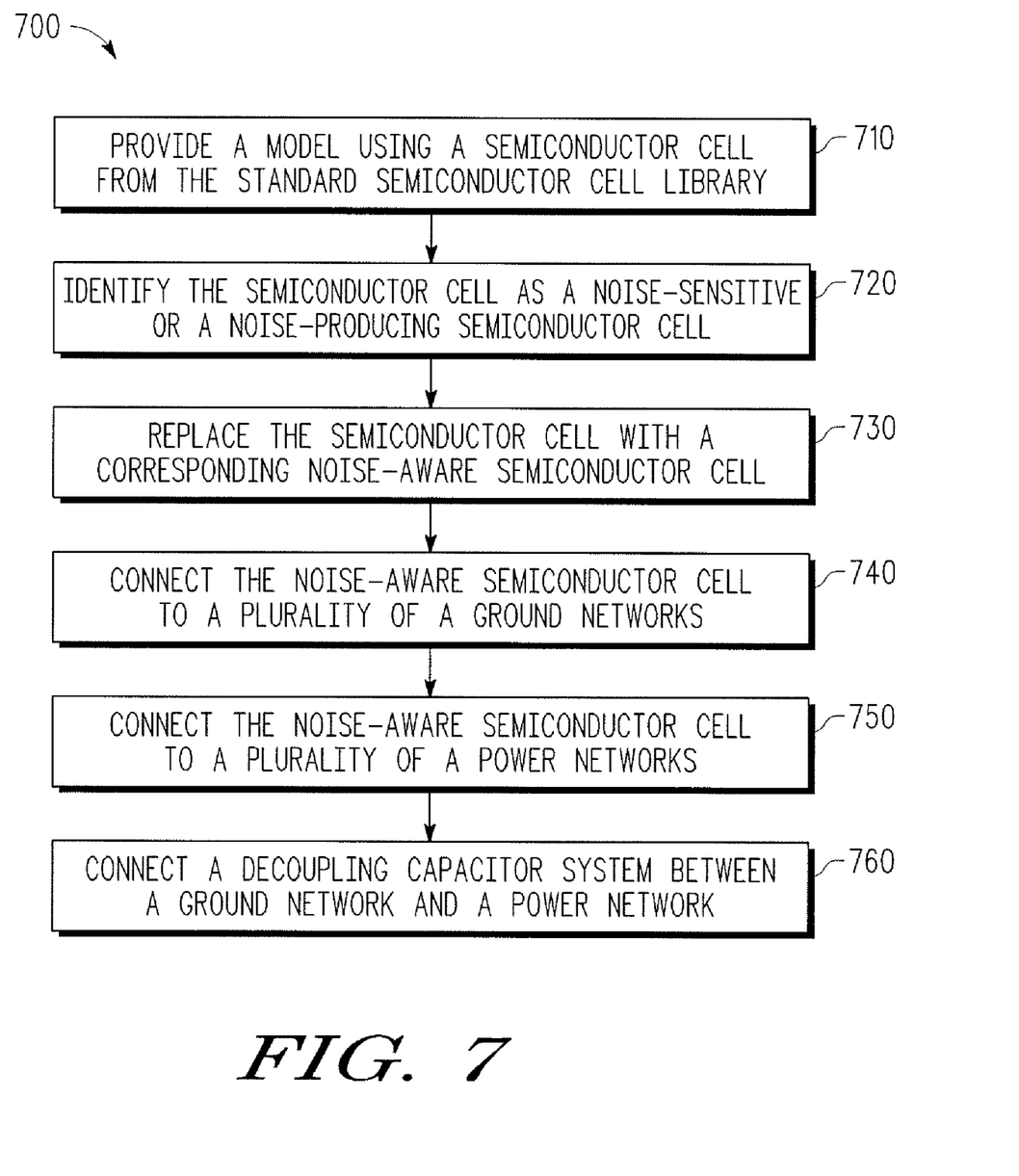
FIG. 7 is a flow diagram representing one exemplary embodiment of a method for designing a semiconductor device using the semiconductor cell(s) of FIG. 2 and/or FIG. 5.

FIG. 7 is a flow diagram of one exemplary embodiment of a method 700 for designing a semiconductor device using standard semiconductor cells and noise-aware semiconductor cells (e.g., semiconductor cells 200 and 500). As discussed above, a standard cell library includes a standard cell for one or more logic functions (e.g., OR, NOR, AND, NAND, etc.), and each logic function may also include different variations of the logic function. For example, a NOR function may include standard cells having multiple sizes, speeds, and/or power efficiencies.

A noise-aware library, according to various embodiments, includes one or more noise-aware semiconductor cells (e.g., semiconductor cells 200 and 500) corresponding to a semiconductor cell in the standard cell library. For example, at least one NOR standard cell identified in the previous example includes a corresponding NOR noise-aware semiconductor cell in the noise-aware library. That is, the NOR noise-aware semiconductor cell includes a structure similar to semiconductor cell 200 or 500 and is capable of performing substantially the same functions as the NOR standard cell.

After a semiconductor device is designed and/or modeled using one or more semiconductor cells from the standard cell library (block 710), at least one semiconductor cell is identified in the design and/or model as a semiconductor cell that receives signals with noise and amplifies the noise in its output signals (e.g., a noise-sensitive semiconductor cell) or a noise-producing semiconductor cell (e.g., an aggressive semiconductor cell) (block 720). The noise-sensitive and/or noise-producing semiconductor cell(s) is/are then replaced by the corresponding noise-aware semiconductor cell(s) (block 730).

Once the semiconductor cell(s) have been replaced with the noise-aware semiconductor cell(s), a plurality of ground networks (e.g., ground networks 250 and 280, or ground networks 550 and 580) are coupled to each noise-aware semiconductor cell (block 740). Similarly, a plurality of power networks (e.g., power networks 230 and 270, or power networks 530 and 570) are coupled to each noise-aware semiconductor cell (block 750). Moreover, a decoupling capacitor system (e.g., decoupling capacitor system 290 or 590) is connected to a power network (e.g., power network 230 or 530) and a ground network (e.g., ground network 250 or 550) of the noise-aware semiconductor cell(s) (block 760).

In summary, various exemplary embodiments disclose a noise-aware semiconductor cell. The noise-aware semiconductor cell comprises a first metal-oxide-semiconductor field-effect transistor (MOSFET) including a doped substrate, a first source, a first gate, and a first drain forming a first source-gate-drain region in the substrate, a first substrate tie formed in the substrate proximate the first source, and a second substrate tie formed in the substrate proximate the first source and the first substrate tie. A first ground rail is coupled to the first source and the first substrate tie, and is configured to be coupled to a first ground network. A second ground rail coupled to the second substrate tie is also included, the second ground rail configured to be coupled to a second ground network.

One exemplary embodiment includes a second MOSFET formed adjacent the first MOSFET to form a complementary-metal-oxide-semiconductor (CMOS) semiconductor cell. Another embodiment includes a bipolar transistor formed in the substrate to form a bipolar complementary-metal-oxide-semiconductor (BiCMOS) semiconductor cell.

In another embodiment, the second MOSFET Includes a doped well formed in the substrate, a second source, a second gate, and a second drain forming a second source-gate-drain region in the well, a first well tie formed in the well proximate the second source, and a second well tie formed in the well proximate the first well tie and the second source. Another embodiment includes a first power rail coupled to the second source and the first well tie, and configured to be coupled to a first power network, and a second power rail coupled to the second well tie, wherein the second power rail is configured to be coupled to a second power network.

In a further embodiment, the second well tie is configured within the semiconductor cell to enable a current path between the first well tie and the second well tie. In another embodiment, the second well tie is configured within the semiconductor cell to enable a current path between the second well tie and the second source-gate-drain region.

The semiconductor cell, in one embodiment, further includes a second MOSFET formed adjacent the first MOSFET, a power rail coupled to the second MOSFET, and a capacitive element coupled between the power rail and the first ground rail. In still another embodiment, the semiconductor cell further includes a bipolar transistor formed in the substrate, the bipolar transistor including a collector proximate the second substrate tie.

Another embodiment includes the second substrate tie configured within the semiconductor cell to enable a current path between the second substrate tie and the first source-gate-drain region. Yet another embodiment includes the second tie configured within the semiconductor cell to enable a first current path between the first substrate tie and the second substrate tie.

Various other exemplary embodiments provide a noise-aware semiconductor cell comprising a first metal-oxide-semiconductor field-effect transistor (MOSFET) including a doped well, a source, a gate, and a drain forming a source-gate-drain region in the well, a first well tie formed in the well proximate the source, and a second well tie formed in the well proximate the first well tie and the source. A first power rail is coupled to the source and the first well tie, and configured to be coupled to a first power network. Furthermore, a second power rail is coupled to the second well tie, the second power rail configured to be coupled to a second power network.

In one embodiment, the second well tie is configured within the semiconductor cell to enable a current path between the second well tie and the source-gate-drain region. In another embodiment, the second well tie is configured within the semiconductor cell to enable a first current path between the first well tie and the second well tie.

The semiconductor cell, in one embodiment, further includes a second MOSFET including a doped substrate with the first MOSFET formed therein, a ground rail coupled to the second MOSFET, and a capacitive element coupled between the first power rail and the ground rail. In another embodiment, the semiconductor cell further includes a bipolar transistor formed adjacent the substrate.

Other exemplary embodiments provide a method for designing a semiconductor device with increased signal integrity using a first semiconductor cell library including a semiconductor cell and a second semiconductor library including a noise-aware semiconductor cell corresponding to the semiconductor cell. In one embodiment, the method includes producing a model of the semiconductor device including the semiconductor cell. Another embodiment includes identifying, in the model, the semiconductor cell as one of a noise-sensitive semiconductor cell and a noise-producing semiconductor cell and replacing the semiconductor cell with the noise-aware semiconductor cell.

In accordance with one embodiment, the method includes coupling a first ground network and a second ground network to the noise-aware semiconductor cell. Another embodiment includes coupling a first power network and a second power network to the noise-aware semiconductor cell.

The semiconductor device, in another embodiment, includes a power network and a ground network coupled to the noise-aware semiconductor cell, and the noise-aware semiconductor cell includes a decoupling capacitor. In this embodiment, the method further includes coupling the decoupling capacitor between the power network and the ground network.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A semiconductor device having a noise-aware semiconductor cell, comprising:
   a first ground network;
   a second ground network that is different from the first ground network;
   a first metal-oxide-semiconductor field-effect transistor (MOSFET) including:
      a doped substrate,
      a first source, a first gate, and a first drain forming a first source-gate-drain region in the substrate,
      a first substrate tie formed in the substrate proximate the first source, and
      a second substrate tie formed in the substrate proximate the first source and the first substrate tie;
   a first ground rail coupled to the first source, the first substrate tie, and the first ground network; and
   a second ground rail coupled to the second substrate tie and the second ground network.

2. The semiconductor device of claim 1, further comprising a second MOSFET formed adjacent the first MOSFET to form a complementary-metal-oxide-semiconductor (CMOS) semiconductor cell.

3. The semiconductor device of claim 2, further comprising a bipolar transistor formed in the substrate to form a bipolar complementary-metal-oxide-semiconductor (BiCMOS) semiconductor cell.

4. The semiconductor device of claim 2, wherein the second MOSFET comprises:
   a doped well formed in the substrate;
   a second source, a second gate, and a second drain forming a second source-gate-drain region in the well;
   a first well tie formed in the well proximate the second source; and
   a second well tie formed in the well proximate the first well tie and the second source.

5. The semiconductor device of claim 4, further comprising:
   a first power rail coupled to the second source and the first well tie, and configured to be coupled to a first power network; and
   a second power rail coupled to the second well tie, the second power rail configured to be coupled to a second power network.

6. The semiconductor device of claim 5, wherein the second well tie is configured within the semiconductor cell to enable a current path between the first well tie and the second well tie.

7. The semiconductor device of claim 5, wherein the second well tie is configured within the semiconductor cell to enable a current path between the second well tie and the second source-gate-drain region.

8. A noise-aware semiconductor cell, comprising:
   a first metal-oxide-semiconductor field-effect transistor (MOSFET) including:
      a doped substrate,
      a first source, a first gate, and a first drain forming a first source-gate-drain region in the substrate,
      a first substrate tie formed in the substrate proximate the first source, and
      a second substrate tie formed in the substrate proximate the first source and the first substrate tie;
   a first ground rail coupled to the first source and the first substrate tie, and configured to be coupled to a first ground network;
   a second ground rail coupled to the second substrate tie, the second ground rail configured to be coupled to a second ground network;
   a second MOSFET formed adjacent the first MOSFET;
   a power rail coupled to the second MOSFET; and
   a capacitive element coupled between the power rail and the first ground rail.

9. The semiconductor device of claim 1, wherein the second substrate tie is configured within the semiconductor cell to enable a current path between the second substrate tie and the first source-gate-drain region.

10. The semiconductor device of claim 1, wherein the second substrate tie is configured within the semiconductor cell to enable a first current path between the first substrate tie and the second substrate tie.

11. The semiconductor device of claim 1, further comprising a bipolar transistor formed in the substrate, the bipolar transistor including a collector proximate the second substrate tie.

12. A semiconductor device having a noise-aware semiconductor cell, comprising:
   a first power network;
   a second power network that is different from the first power network;
   a first metal-oxide-semiconductor field-effect transistor (MOSFET) including:
      a doped well,
      a source, a gate, and a drain forming a source-gate-drain region in the well,
      a first well tie formed in the well proximate the source, and
      a second well tie formed in the well proximate the first well tie and the source;
   a first power rail coupled to the source, the first well tie, and the first power network; and
   a second power rail coupled to the second well tie and the second power network.

13. The semiconductor device of claim 12, wherein the second well tie is configured within the semiconductor cell to enable a current path between the second well tie and the source-gate-drain region.

14. The semiconductor device of claim 12, wherein the second well tie is configured within the semiconductor cell to enable a first current path between the first well tie and the second well tie.

15. A noise-aware semiconductor cell, comprising:
   a first metal-oxide-semiconductor field-effect transistor (MOSFET) including:
      a doped well,
      a source, a gate, and a drain forming a source-gate-drain region in the well,
      a first well tie formed in the well proximate the source, and
      a second well tie formed in the well proximate the first well tie and the source;
   a first power rail coupled to the source and the first well tie, and configured to be coupled to a first power network;
   a second power rail coupled to the second well tie, the second power rail configured to be coupled to a second power network;
   a second MOSFET including a doped substrate with the first MOSFET formed therein;
   a ground rail coupled to the second MOSFET; and
   a capacitive element coupled between the first power rail and the ground rail.

16. The semiconductor device of claim 15, further comprising a bipolar transistor formed adjacent the substrate.

* * * * *